United States Patent
Spahn

(10) Patent No.: US 7,113,096 B2
(45) Date of Patent: Sep. 26, 2006

(54) DEVICE AND METHOD FOR IDENTIFYING A COMPONENT SURROUNDED BY AN OUTER PACKAGE

(75) Inventor: Martin Spahn, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 48 days.

(21) Appl. No.: 10/944,590

(22) Filed: Sep. 17, 2004

(65) Prior Publication Data

US 2005/0073414 A1    Apr. 7, 2005

(30) Foreign Application Priority Data

Sep. 19, 2003  (DE) ................................ 103 43 497

(51) Int. Cl.
*G08B 13/14* (2006.01)
(52) U.S. Cl. ................................. 340/572.8; 340/572.1
(58) Field of Classification Search ............ 340/572.1, 340/572.4, 572.7, 572.8, 10.1, 10.42, 10.6; 235/385, 487; 257/676, 714, E21.599, E23.037
See application file for complete search history.

(56) References Cited

U.S. PATENT DOCUMENTS 5,252,962 A    10/1993   Urbas et al.
6,340,931 B1 *  1/2002  Harrison et al. ......... 340/572.1
6,446,208 B1 *  9/2002  Gujar et al. ................ 713/185
6,608,561 B1 *  8/2003  Lawler et al. ........... 340/572.8

FOREIGN PATENT DOCUMENTS

DE    199 40 086 A1   3/2001
GB    2 243 043 A    10/1991
GB    2 308 947 A     7/1997

OTHER PUBLICATIONS

Siemens AG, "RF-Identifikationssysteme MOBY" http://web.archive.org/web/20030422073922/www.ad.siemens.de/moby/html00/uebersicht.htm, Apr. 22, 2003, pp. 1-5.

* cited by examiner

*Primary Examiner*—Van T. Trieu

(57) ABSTRACT

Device and method for identifying a component surrounded by an outer package A device (11) for identification of a component (2) surrounded by an external package (12, 19) is described. For this purpose an identification element (14) is arranged in the area of the component (2). The identification element (14) can be identified through the external package by means of an acoustic method and/or scanning method. Furthermore a method for identifying a component (2) surrounded by an external package (12, 19) using the device in accordance with the invention (11) is described.

20 Claims, 2 Drawing Sheets

DEVICE AND METHOD FOR IDENTIFYING A COMPONENT SURROUNDED BY AN OUTER PACKAGE

CROSS REFERENCE TO RELATED APPLICATIONS

This application claims priority to the German application No. 10343497.6, filed Sep. 19, 2003 and which is incorporated by reference herein in its entirety.

FIELD OF INVENTION

The invention relates to a device for identification of a component surrounded by an external package, especially a semiconductor X-ray detector. In addition the invention relates to a method of identifying a component surrounded by an external package.

BACKGROUND OF INVENTION

For many years digital X-ray detectors have been changing classical radiography. The wide variety of newer technologies which have been in use for a long time or are becoming mature enough to be marketed include image enhancement camera systems based of television or CCD cameras, memory foil systems with integrated or external read-out unit, systems with optical coupling of the converter foil to CCDs or CMOS chips, selenium-based detectors with electrostatic readout as well as semiconductor detectors with active readout matrices with direct or indirect conversion of the X-ray radiation.

In particular various innovative semiconductor X-ray detectors for digital X-ray imaging have been under development for some years now, using various technologies to convert the original X-ray image information into a form that can be evaluated to produce electronic images. One option is to initially convert the original image information in an X-ray converter, consisting for example of cesium-iodide, into electromagnetic radiation with a low frequency, and subsequently convert it and store it in a photo-diode matrix into a electrical charge pattern corresponding to the image information. The charge pattern stored latently within the photo diode matrix is then read out and processed further to create the image.

A further technology for example uses semiconductor X-ray converters made of selenium which generate an electrical charge pattern directly which corresponds to the original image information. The latent stored charge pattern in the X-ray converter is then in its turn read out and further processed for image processing.

The conversion layers of these types of semiconductor X-ray detectors, which use X-ray converters based on cesium-iodide, selenium or other materials do not have any complete resistance to external climatic influences, such as for example temperature, humidity or air pressure. Furthermore these types of semiconductor X-ray detectors are sensitive to electromagnetic radiation as well as to any form of electrostatic charge.

Comprehensive precautions therefore need to be taken up when dispatching such semiconductor X-ray detectors. One is to apply waterproof and air-tight layers during manufacturing to protect the X-ray converter layer against external climatic influences. These layers however do not guarantee any complete protection for the expensive sensors. Another precaution is to pack the semiconductor X-ray detectors in a metalized, antistatic, i.e. opaque and frequently also partly evacuated plastic foil. The plastic foil is tightly hermetically sealed or sealed in some other way to give this protection.

SUMMARY OF INVENTION

For checking purposes it is often necessary, before dispatching or at further checking points within a transport chain, to make another check as to whether the semiconductor X ray detector is in the external package. The check has previously been made by reading a label or such like affixed to the semiconductor X-ray detector which bears the component information. For this purpose the opaque external package has to be opened again, in which case because of possible damaging compensation formation on the X ray detector or within the external package, it is necessary to wait up to 48 hours. After the check has been made the semiconductor X-ray detector must again be put into the external package. Subsequently the external package must be tightly resealed, for example heat sealed and partly evacuated.

Options have since been provided for using what are known as transponders for identification of an object without visual contact, these devices using radio waves to send an identification code or similar to a suitable readout device. Various transponders are described for example in GB 2 308 947 A, DE 41 43 561 C2 or DE 199 40 086 A1. However these systems generally only function under some circumstances or in many cases not at all if the object to be identified or the transponder arranged on it or in it is itself surrounded by a metalized packaging through which electromagnetic radiation cannot pass. This is generally the case as described above with semiconductor X-ray detectors, which are protected against electromagnetic radiation as well as electrostatic charge.

An object of the present invention is thus to create a device that can also be used in the above case as well as a corresponding method for identifying a component surrounded by an external package, especially a semiconductor X-ray detector, which removes the need to open an external package beforehand for the purposes of identifying the component contained within it.

This object is achieved by the claims.

In accordance with the invention the proposed device features an identification element arranged for the component within the external package via which an acoustic method and/or a scanning method can be used through the external package to identify the element. In accordance with the inventive method an identification element is arranged on the component and the identification element is identified through the external package using the acoustic method and/or scanning method.

By contrast with the identification elements already known in the prior art in the form of transponders, secure identification of the component through the external package is possible using the inventive method even if the external packaging of the component does not allow electromagnetic radiation to pass through. Thus the method can be used without any problems for the purposes mentioned at the beginning of this document for fast identification of a semiconductor X ray detectors.

In a preferred exemplary embodiment of the device the identification element is arranged directly on or in the component. This securely guarantees that the identification element is uniquely assigned to the component.

Preferably component information to identify the component is stored in the identification element. The component information can for example be the generic variant, the series and/or the type of the component. Preferably the component information however contains data for complete identification of the component, for example a consecutive serial or production number etc. This ensures a secure, unique identification of the component.

Advantageously the device features a readout device and the identification element is embodied such that the component information can be transmitted by means of the acoustic methods or the scanning method from the identification element to the read-out device and can then for example be displayed using a display device. This embodiment means that the component information on the component itself does not absolutely have to be a available in a form which can be read and understood directly by a human being. Furthermore the information density on the information element can be increased compared to directly discernable types of representation. Further this embodiment guarantees that only authorized personnel who are in possession of the readout device can undertake identification of the component. In addition this embodiment allows integration of the inventive device into automatic manufacturing, packaging and dispatch sequences.

With an especially advantageous embodiment the component information can be transferred to the readout device using an acoustic coupling and for example displayed using the display device. For example the identification element or an acoustic transmit device assigned to it can send out a suitable acoustic signal to identify the component to the readout device.

A further advantageous embodiment of the invention makes provision for the component information to be discerned by a user, e.g. a checker, by scanning and/or directly by listening through the external package. This embodiment makes possible an especially simple and thereby low-cost manufacturing of the identification element in accordance with the invention.

In this case for example component information arranged on the identification element can be embodied in the form of Braille or another type of coding so that it can be read by touch. The result of this embodiment is that the component information arranged in touch-sensitive form on the identification element can be perceived in a standardized and widely known way by a large number of users through scanning the external package of the semiconductor X ray detector with their fingers.

With an alternative the component information is formed from a series of tones with different or essentially the same frequency and/or with a different or essentially the same duration which are sent out by the identification element or by an acoustic transmit device assigned to it, in which case the component information can be discerned acoustically through the external packaging. This embodiment guarantees that the component information can be read out by a user and/or the readout device.

The component or identification element or the transmit device can be equipped with an energy supply unit, for example a battery, a storage capacitor or a rechargeable cell.

It is especially preferred for the identification element to be an integral part of the component. The advantage of this is that the identification element can no longer be detached from any component and thus guarantees a secure and unique identification. The other advantage is that error sources caused by applying an identification element that is not suitable for the component involved are excluded since the element is integrated during the manufacturing process of the component into the component itself. The component and the identification element are produced at low cost in one manufacturing step. Finally this embodiment prevents attempts at manipulation which are intended to intentionally put incorrect component information on the component or to swap existing component information for other component information. Thus the identification element is at the same time a seal of quality and origin for the component equipped with it.

The further dependent claims contain further advantageous embodiments of the invention.

BRIEF DESCRIPTION OF THE DRAWINGS

The device in accordance with the invention is explained in more detail below with reference to the enclosed Figures, based on an exemplary embodiment. The figures show.

DETAILED DESCRIPTION OF INVENTION

Figure 1:
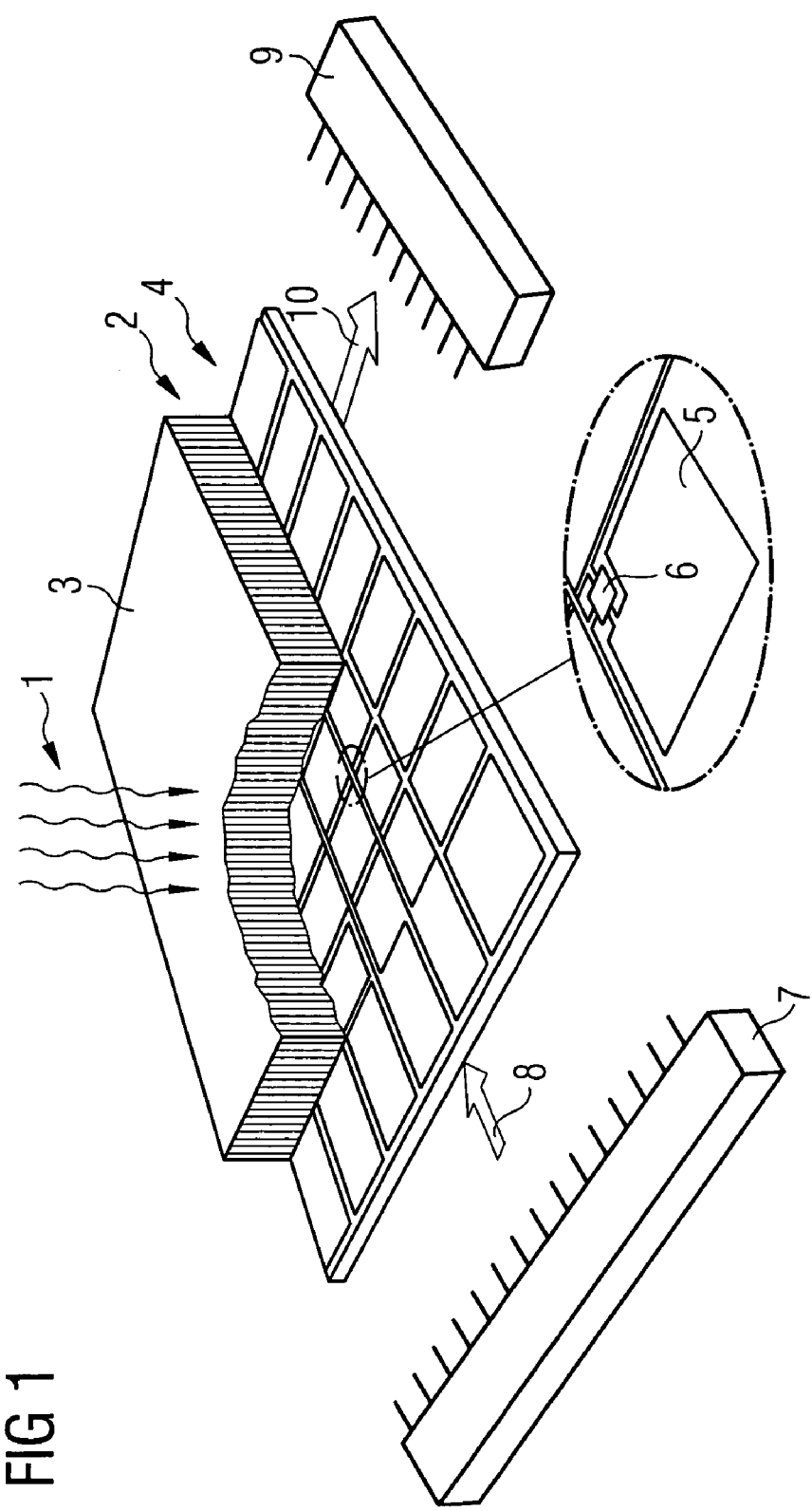
FIG. 1a basic layout of a semiconductor X-ray detector with an X-ray converter as well as parts of the associated evaluation electronics, FIG. 2 an exemplary embodiment of a device in accordance with the invention for identification of a semiconductor X-ray detector.

FIG. 1 shows an exemplary embodiment of a component 2 a semiconductor X-ray detector 2, on which imaging X-radiation 1 occurs.

The semiconductor X-ray detector 2 features in the direction of the X radiation 1 an image-sensitive X-ray conversion layer 3. In the X-ray conversion layer 3 the arriving X radiation 1 is converted into electromagnetic radiation at low frequency, for example light. The light is then detected by an active readout matrix 4 located immediately be hind the X-ray conversion layer 3 and converted into a latent electrical charge pattern corresponding to the X-ray image. To this end the readout matrix 4 features a number of photo diode elements 5 arranged in a matrix-shaped geometrical structure of which the electrical potential can be read out in each case via an active switching element 6—for example an integrated transistor or a diode. The electrical potential of the photo diode elements 5 is in this case proportional to the intensity of the X radiation 1 arriving in this area. The photo diode elements 5 are activated for example sequentially via a row driver 7 in the direction of an arrow 8. The photo diode elements 5 are read out in the exemplary embodiment shown in FIG. 2 by a column driver 9 in the direction of an arrow 10, in which case the outgoing signals in the direction of the arrow are fed in a known way to suitable signal processors, amplifiers, multiplexers or similar and are subsequently digitized in analog-to-digital converters to obtain the images and made available for further processing.

The X-ray conversion layer 3 of the semiconductor X-ray detector 2 shown is particularly sensitive to external climatic influences. The semiconductor X-ray detector 2 shown in FIG. 1 only represents a known embodiment for these types of X-ray detectors. A multiplicity of semiconductor X-ray detectors employing different technologists are known which are used to obtain X-ray images. Common to all of them is however sensitivity to external climatic influences which makes it necessary to enclose them in an expensive external package for dispatch.

Figure 2:
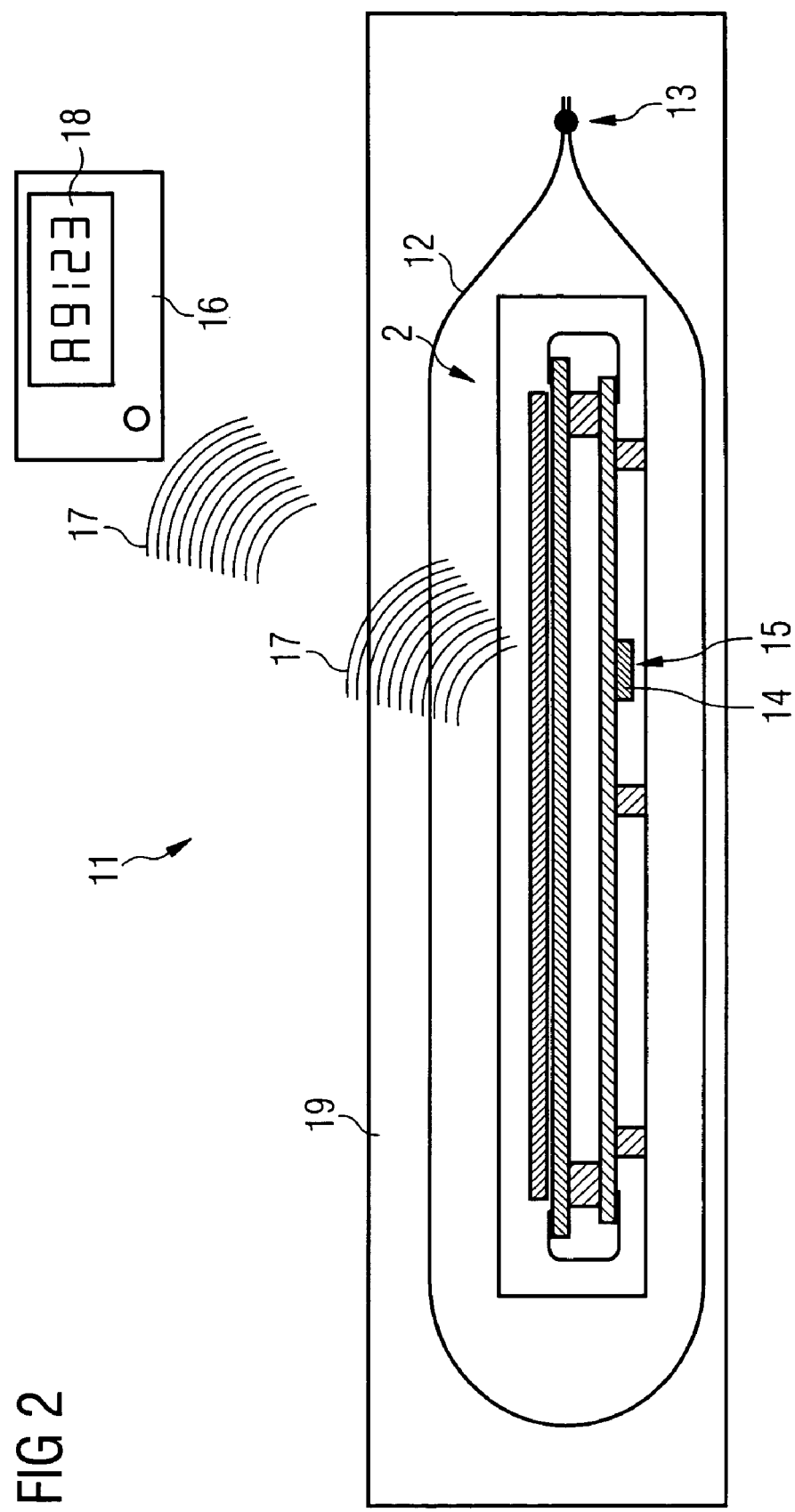

FIG. 2 shows the layout of a device 11 for identification of a component 2 completely surrounded by a number of external packages 12, 19, in the exemplary embodiment shown the X-ray detector 2. Basically the inventive device 11 makes it possible to identify components of all types within any forms of packaging, meaning that the device 11 is not restricted to the identification of semiconductor components.

An inner external package 12 is embodied here in such a way that that it completely and tightly surrounds the semiconductor X-ray detector 2. Since semiconductor X-ray detectors react to external climatic influences, the inner external package 12 is embodied as a self-contained plastic foil bag which is tightly closed in a sealing area 13, for example heat sealed. Instead of a foil bag a plastic foil sheet welded on both sides, a folded plastic foil sealed on three sides or similar can of course be used for the external packaging of semiconductor X-ray detector 2.

The inner external package 12 is also preferably partly evacuated to prevent damaging build-up of condensation for the semiconductor X-ray detector 2 inside the external package 12 and on the surface of the detector 2 if the temperature varies, as well as corrosive processes caused by the hydrogen content of the surrounding air. Alternatively it is also possible to fill the inner external package 12 with an inert protective gas. Even with a part evacuation of the external package 12, if there is a larger temperature gradient between the environment and the semiconductor X-ray detector 2 it is basically necessary to wait before opening the inner external package 12 until the temperature between the environment and the semiconductor X-ray detector 2 has equalized and any condensation water is evaporated. In individual cases it can be necessary for this purpose to wait up to 48 hours before the external package 12 can be opened without the risk of damaging the semiconductor X-ray detector 2. This precautionary measure in particular avoids formation of condensation on the surface of the semiconductor X-ray detector 2 as well as on the inner external package 12 and especially damage to the X-ray conversion layer 3 of detector 2.

The inner external package 12 preferably formed from a plastic is metalized. The metallization of the plastic foil is required on one hand to protect the semiconductor X-ray detector 2 against damaging electrostatic charges. At the same time the metallization of the plastic foil additionally preserves the semiconductor X-ray detector 2 against external strong electromagnetic fields. In this case it is not always necessary to design the external package 12 so that it is metalized over its entire surface. Sufficient protection from electrostatic charge and external electromagnetic influences is provided by metalizing just part of the foil, for example in the geometric form of a suitably dense grid or similar. Metalizing all of the surface has the additional advantage that the diffusion density of the plastic foil used for the external package 12 is increased compared to a non-metalized plastic foil.

The application of the metallization to the inner external package 12 means that identifying the semiconductor X-ray detector 2 by means simple optical facilities—for example by a label affixed to the semiconductor X-ray detector with a corresponding readable type designation—through the external package 12 is not as a rule possible. Likewise a normal simple transponder which sends out an electromagnetic signal to identify the component cannot be used. For secure identification it would thus not be possible to avoid opening the inner external package 12 for secure identification, which, especially with larger temperature gradients between the environment and the detector 2 because of possible formation of condensation—as already explained above—could lead to significant delays.

As shown in FIG. 2 the semiconductor X-ray detector enclosed by the inner external package 12 is also placed for dispatch in a further outer external package 19 in the form of a transport box 19. This transport box 19 can for example be made of cardboard or plastic. In addition the entire external package can feature further packaging elements not shown in the diagram consisting of for example of a carton, filler materials or similar. In particular additional outer waterproof protective covers can be provided or a larger transport box in which the transport box 19 shown in FIG. 2 is inserted.

In order to avoid, especially if there temperature differences between the environment and the detector, a tedious wait before actually opening the inner external package 12 for the purposes of identification of the detector, the exemplary embodiment shown in accordance with invention has an identification element 14 arranged underneath the semiconductor X-ray detector 2, where the identification element 14 contains component information 15, typically the form or the type or a precise serial number etc. of the semiconductor X-ray detector 2 contained in the external package 12. The component information 15 is contained within the identification element 14, preferably in electronic form, but can be held in some other form. The identification element 14, apart from the component information 15, can additionally contain further information, for example the manufacturing point, the manufacturer's name, the previous operating time as well as information about the remaining operating life of the semi-conductor X-ray detector or similar.

The identification element 14 can basically be arranged in any areas of the surface of the semiconductor X-ray detector 2 or also within the detector 2 itself, provided this does not impede the subsequent function of the semiconductor X-ray detector 2. The identification element 14 should however preferably be fixed to the semiconductor X-ray detector 2.

Especially preferred is to attach the identification element 14 on or in the semiconductor X-ray detector in such a way that it can be released without destroying or having a long-term adverse effects on the functions of the latter. This enables manipulations and errors as a result of incorrect external ticketing or labeling of the external package 12 which do not correspond to the semiconductor X-ray detector 2 contained within it to be avoided by checking the component information 15 contained in the identification element 14.

The identification element can for example be glued, bonded, or attached in some other way to the semiconductor X-ray detector 2. Also conceivable is a flexible link between identification element 14 and the semiconductor X-ray detector 2, for example a means of a band, a chain, a thread or similar. Alternatively additional security seals can be provided to prevent manipulation of the identification element 14.

In accordance with a further exemplary embodiment not shown in the diagram it is possible to integrate the identification element directly into the semiconductor X-ray detector 2. The advantage of this embodiment is that a manipulation relating to the component information 15 of the semiconductor X-ray detector 2 is made more difficult and a relatively secure and unique identification of the detector is possible. Furthermore, by a direct integration of the identification element 14 into the semiconductor X-ray detector 2 the manufacturing costs can be reduced. Furthermore this embodiment makes possible a secure verification of the origin of the semiconductor X-ray detector 2 if for example the component information 15 is supplemented by an authentication code.

In the exemplary embodiment shown in FIG. 2 an acoustic coupling is used to transmit the stored component information 15 from the identification element 14 readout device 16 located outside the external package 12, 19. Sound of any frequency can be considered for the external coupling. It is thus conceivable for example to use sound in the audible range, ultrasound or infrasound.

The acoustic signals 17 are emitted in this case by a transmit device not shown in greater detail in the drawing, preferably integrated into the identification element 14. The transmit device can for example consist of a device for creating an acoustic carrier frequency as well as a modulation device for modulating the component information 15 into a suitably coded form on the carrier frequency.

The identification element 14 preferably has its own power supply, for example a battery, a rechargeable cell or a memory capacitor.

The readout device 16 here features a display device 18. The component information 15 transmitted in the form of the acoustic signals 17 from the identification element 14 to the readout device 16 is converted in the readout device 16 using known electronic means in such a way, for example decoded or such like, that it can be reproduced on the display unit 18 in a discernable form. In this connection the idea in particular is to have an acoustic output which can be acoustically and/or optically discerned by a user.

In accordance with a further exemplary embodiment it is possible to buffer the component information 15 in the readout device 16 or the display device 18 and forward it to further functional units not shown in the diagram. This enables the device 11 to be integrated into fully-automatic packaging, checking and dispatch systems for example.

The identification element 14 can for example output the component information coded by a random sequence of tones of different or essentially the same frequency and/or with a different or essentially the same duration. Also conceivable is encoding of the component information 15 by a random sequence of tones in essentially the same frequency but with different or essentially the same duration. Likewise any combination of the options depicted here could be used.

In this case it is also possible for the component information 15 acoustically emitted by the identification element to be output in a form which can be directly heard and interpreted by a user. Both the readout device 16 and also the display device 18 are not absolutely necessary in the case of an acoustic output in the audible range if signals are used which can be interpreted by a user.

The component information 15 could basically be output continuously. More energy saving and thus preferable however is an output only on request by the readout device 16 or by a user. A prior "activation" of the identification element 14 by the readout device 16 is possible, by for example an acoustic activation signal being transmitted by to the read-out device 16 or in some other way to the identification element 14. In this case a suitable recipient is needed at the identification element 14, for example as part of the transmit device, which is on standby and reacts to a specific activation signal. A manual "activation" by a user is also possible. Thus for example an additional operating element—for example a push button—can be arranged in the vicinity of the identification element 14 which can be activated through the inner external package from outside by a user or in some other way, which then triggers the transmission of the component information stored in the identification element 14. However in this case the semiconductor X-ray detector 2 must be removed from the outer external package 19 for identification, but the inner external package 12 can remain closed.

In the area of the acoustic coupling between the identification element and the readout device 16 it is also possible in accordance with a further embodiment to use an acoustic resonator. The identification element is in this case embodied as an acoustic resonator which can only be triggered through the external package by a previously defined frequency. This resonant frequency represents the component information of the semiconductor X-ray detector. To read out the component information the readout device runs through a specific sound frequency band until a specific sound frequency resonance occurs. The component information is then available in the form of the resonant frequency which can easily be measured. The advantage of this embodiment is that no separate energy supply is needed for the identification element.

To execute the method of identification shown in figures the identification element 14 is first applied to the semiconductor X-ray detector 2. The identification element 14 in this case contains the component information 15 described above. Subsequently the component 2 is put into the inner metalized external package 12. Then this external package 12 is partly evacuated or filled with a suitable protective gas.

Alternatively it is possible to leave the surrounding air in the external package 12. In a further procedure step the external package 12 is hermetically sealed. Subsequently the component is put into the outer external package 19. Finally in this way a component 2 furnished with an external package is directed to further stages of production, for example stored, dispatched etc.

If the repackaged component 2 is now to be subjected to a content check, the read-out device is moved into the vicinity of the component 2 equipped with the external packages 12, 19 and for example the transmit device of the identification element 14 is activated by transmitting an acoustic signal. This then transmits the component information 15 in the form of acoustic signals 17, which are received by the readout device 16. The component information 15 is then presented in receivable form by the display device 18. This method makes possible an exact identification of the component contained in the external packages 12, 19, in which case neither of the inner external package 12 nor the outer external package 19 needs to be opened to do this.

As explained in detail further above the component information 15 can be read in other ways than acoustically through the external packages 12, 19.

Thus, with an exemplary embodiment of the inventive device not shown in the diagram the component information can be scanned through the inner external package by a user or can be scanned by a read out device arranged on the identification element.

In this case the identification element is preferably arranged in the area of the side pointing upwards towards the external package or in the area of the outer edges of the semiconductor X-ray detector. Compared to arranging the identification element in the area of the underside of the semi-conductor X-ray detector, this has the advantage that the component information held in the identification element cannot only be read if the detector is lifted away the surface below it from below through the inner external package. The component information is embodied on the identification element in such a way that for example it is present in the form of a coded sequence of protrusions and/or indentations which can be directly felt and touched through the external package with the fingers. The protrusions and/or indentations can be formed on the identification element of using any manufacturing processes, for example drilling, etching, stamping, engraving, milling, sawing, spraying or similar and represent the component information in coded form. In an especially preferred embodiment of the invention of the component, information is created on the identification element in the form of known coding for example in the form of Braille.

In a further variant of the invention not shown in the diagram the protrusions and/or indentations are made directly on the semiconductor X-ray detector, meaning that the protrusions and/or indentations containing the component information form the identification element itself. This embodiment provides an especially simple and thus low-cost integration of the component information directly into the semiconductor X-ray detector even during the manufacturing process. It is thus possible for example to incorporate the protrusions and/or indentations during the manufacturing process of the semiconductor X-ray detector while the normal etching stage is being carried out during semiconductor production. This provides particularly high security against undesired manipulations on the identification element as regards the component information and also against subsequent swapping of the identification element.

The readout device 16, the display device 18 as well as the transmission of the component information 15 by means of a suitable coupling mechanism by the identification element 14 to the readout device 16 by using acoustic signals 17 can be omitted in the case of direct scanning of the component information 15 by a user.

It is equally possible to use a readout device which is able to scan the component information through the external pack-age and to present it on the display device in a discernable form. In this case the readout device must for example have a suitable mechanical scanner which can be moved from outside by the user over the external package in the area of the information element.

A further embodiment variant represents inclusion of the component information by means of a coded sequence of small permanent magnets on the identification element. The component information can in this case be scanned using Hall sensors and then directed to the readout device or the display device for further processing. Alternatively a magnetic stripe with an appropriately high magnetic field strength could also be used which contains the component information in coded form and for which the magnetic field can be scanned through the external package using a suitable scanner, for example a Hall sensor.

The method in accordance with the invention produces a significant saving in the work involved in all activities occurring in relation to packaged components such as for example production, storage, quality checking, dispatch, repair and such like. The exemplary embodiments of the invention described above in this case merely represent typical embodiments. A plurality of further embodiments of the invention are conceivable and are encompassed by the idea behind the invention, even if they are not described in detail in the descriptions given in this document. In particular the very widest range of combinations of the variants described are possible.

The invention claimed is:

1. A device for identifying a semiconductor component sensitive to electromagnetic radiation and temperature changes, the device comprising a metallized and sealed inner package for shielding the component from electromagnetic radiation and/or temperature changes, the inner package being enclosed by a nontransparent outer package, the device further comprising an identification element on the component within the inner package for identifying the component through the outer package using an acoustic or a scanning signal.

2. The device according to claim 1, wherein the acoustic or the scanning signal is emitted by the identification element.

3. The device according to claim 1, wherein the acoustic or the scanning signal is emitted by a readout device and received by the identification device.

4. The device according to claim 1, wherein the identification element is arranged directly on a surface of the component or within the component.

5. The device according to claim 1, wherein a component information for identifying the component is stored in or arranged at the identification element.

6. The device according to claim 5, wherein the information element is adapted to transmit the component information to a readout device using the acoustic or the scanning signal.

7. The device according to claim 6, wherein the readout device is a human ear and the component information is perceptible by listening through the outer package.

8. The device according to claim 5, wherein the component information is perceptible by listening through the outer package.

9. The device according to claim 5, wherein the component information is represented by a sequence of sounds having an element selected from the group consisting of different frequencies, the same frequency, different duration and the same duration.

10. The device according to claim 5, wherein the component information includes Braille.

11. The device according to claim 5, wherein the component information is read out using a scan signal applied to the information element.

12. The device according to claim 5, wherein the component information is adapted to be read out by scanning the information element.

13. The device according to claim 12, wherein the identification element includes a barcode.

14. A method of identifying a semiconductor component sensitive to electromagnetic radiation and temperature changes, the method comprising;

shielding the component from electromagnetic radiation and/or temperature changes with an inner package;

surrounding the inner package with nontransparent outer package;

obtaining component information for identifying the component shielded by the inner package through the outer package;

storing the information for identifying the component in an information element disposed on the component within the inner package; and transmitting the component information through the inner and outer packages to a readout device using an acoustic or a scanning signal.

15. The method according to claim 14, wherein the readout device is a human ear.

16. The method according to claim 14, wherein the acoustic signal is a sequence of sounds.

17. The method according to claim 14, wherein the identification element is arranged on a surface of the component or within the component.

18. The method according to claim 14, wherein the component information is read out by listening through the nontransparent external package.

19. The method according to claim 14, wherein the acoustic or the scanning signal is emitted by the identification element.

20. The method according to claim 14, wherein the acoustic or the scanning signal is emitted by the readout device and received by the identification device.

* * * * *